US012650565B2

(12) United States Patent
Huang et al.

(10) Patent No.: US 12,650,565 B2
(45) Date of Patent: Jun. 9, 2026

(54) OPTICAL TRANSCEIVER MODULE TEMPERATURE CONTROL DEVICE AND OPTICAL TRANSCEIVER MODULE TEMPERATURE CONTROL METHOD

(71) Applicant: Formerica Optoelectronics, Inc., Hsinchu County (TW)

(72) Inventors: Yun-Cheng Huang, Hsinchu County (TW); Yi-Nan Shih, Hsinchu County (TW); Chih-Chung Lin, Hsinchu County (TW); Yun-Chin Tsai, Hsinchu County (TW)

( * ) Notice: Subject to any disclaimer, the term of this patent is extended or adjusted under 35 U.S.C. 154(b) by 270 days.

(21) Appl. No.: 18/493,097

(22) Filed: Oct. 24, 2023

(65) Prior Publication Data

US 2024/0134136 A1    Apr. 25, 2024
US 2024/0231023 A9    Jul. 11, 2024

Related U.S. Application Data

(60) Provisional application No. 63/419,028, filed on Oct. 25, 2022.

(51) Int. Cl.
*G02B 6/42*       (2006.01)
*H05K 1/02*       (2006.01)

(52) U.S. Cl.
CPC ......... *G02B 6/4271* (2013.01); *G02B 6/4246* (2013.01); *G02B 6/428* (2013.01); *H05K 1/0203* (2013.01); *H05K 2201/10151* (2013.01); *H05K 2201/10219* (2013.01)

(58) Field of Classification Search
CPC .... G02B 6/4271; G02B 6/4246; G02B 6/428; H05K 1/0203; H05K 2201/10151; H05K 2201/10219
See application file for complete search history.

(56) References Cited

U.S. PATENT DOCUMENTS

| | | | | |
|---|---|---|---|---|
| 6,667,998 | B1 * | 12/2003 | Lo | H01S 5/0687 |
| | | | | 372/98 |
| 7,215,891 | B1 * | 5/2007 | Chiang | H04B 10/40 |
| | | | | 398/195 |
| 2006/0203862 | A1 * | 9/2006 | Bonen | H01S 5/02453 |
| | | | | 372/34 |
| 2006/0291865 | A1 * | 12/2006 | Margaritis | H04J 14/0227 |
| | | | | 398/135 |

(Continued)

*Primary Examiner* — Pranesh K Barua

(57) ABSTRACT
An optical transceiver module temperature control device includes a processor, a printed circuit board assembly, an optical transceiver module and a temperature adjustment element. The processor is configured to measure an ambient temperature. The printed circuit board assembly includes a first side and a second side. The first side is opposite to the second side. The optical transceiver module is disposed on the first side of the printed circuit board assembly. The temperature adjustment element is coupled to the processor and disposed on the second side of the printed circuit board assembly. The processor is configured to generate a temperature adjustment signal according to the ambient temperature and an operating temperature range. The temperature adjustment element is configured to perform heat exchange with the printed circuit board assembly according to the temperature adjustment signal to adjust a temperature of the optical transceiver module into the operating temperature range.

20 Claims, 7 Drawing Sheets

(56)  References Cited

U.S. PATENT DOCUMENTS

| | | | | |
|---|---|---|---|---|
| 2008/0187319 | A1* | 8/2008 | Stewart | H01S 5/0612 |
| | | | | 398/136 |
| 2010/0232800 | A1* | 9/2010 | Meadowcroft | G02B 6/4246 |
| | | | | 398/139 |
| 2018/0054918 | A1* | 2/2018 | Wang | H05K 1/0203 |
| 2019/0068288 | A1* | 2/2019 | Saad | H04B 10/50595 |
| 2019/0181954 | A1* | 6/2019 | Kawase | H01S 5/02325 |
| 2020/0335936 | A1* | 10/2020 | Kim | G02B 6/4206 |
| 2022/0020893 | A1* | 1/2022 | Heanue | H10F 55/00 |
| 2022/0206285 | A1* | 6/2022 | Lee | G01S 7/4817 |

* cited by examiner

300

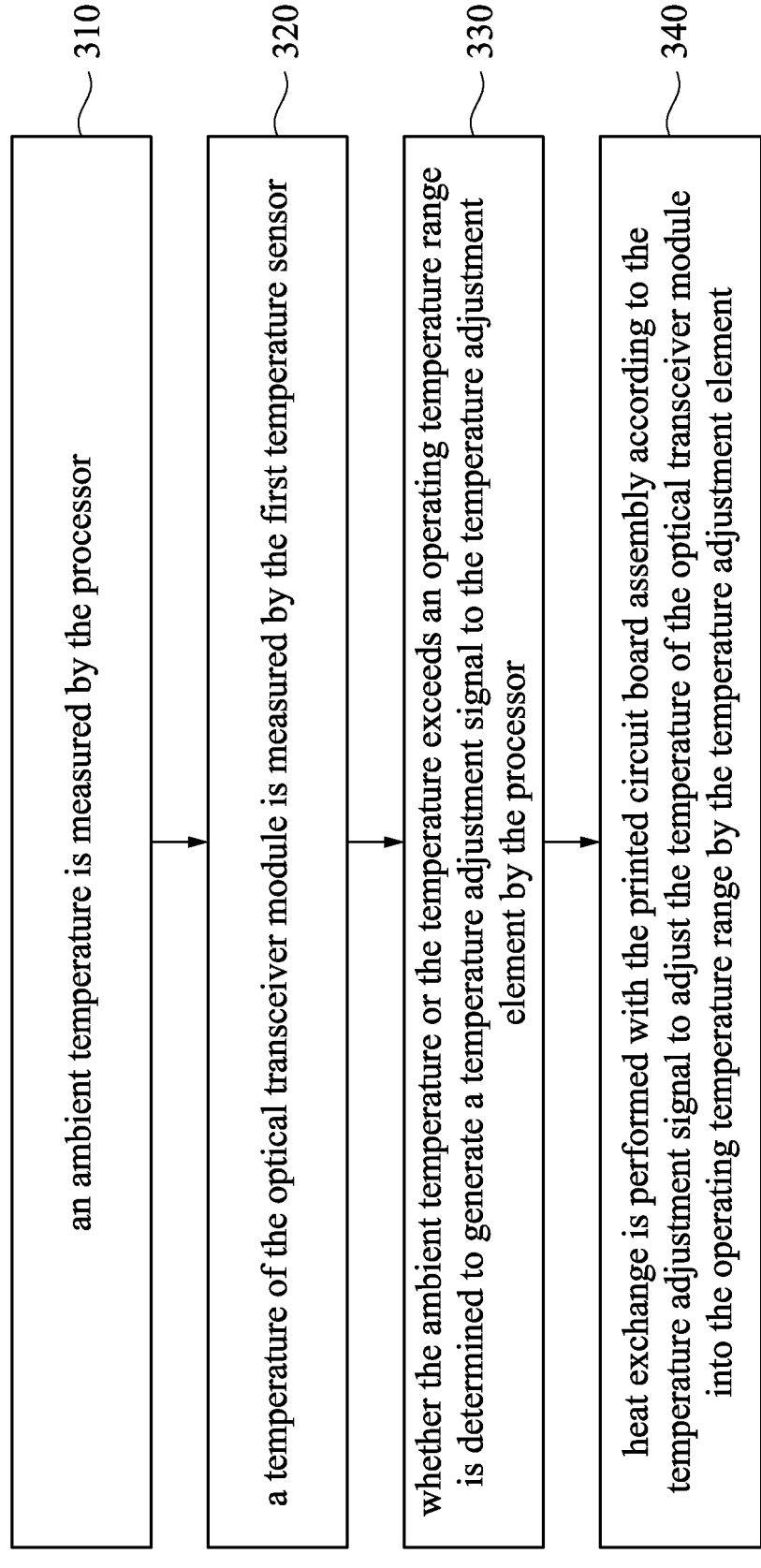

310 — an ambient temperature is measured by the processor

320 — a temperature of the optical transceiver module is measured by the first temperature sensor 330 — whether the ambient temperature or the temperature exceeds an operating temperature range is determined to generate a temperature adjustment signal to the temperature adjustment element by the processor 340 — heat exchange is performed with the printed circuit board assembly according to the temperature adjustment signal to adjust the temperature of the optical transceiver module into the operating temperature range by the temperature adjustment element

Fig. 7

OPTICAL TRANSCEIVER MODULE TEMPERATURE CONTROL DEVICE AND OPTICAL TRANSCEIVER MODULE TEMPERATURE CONTROL METHOD

CROSS-REFERENCE TO RELATED APPLICATION

This application claims priority to U.S. Provisional Application Ser. No. 63/419,028, filed Oct. 25, 2022, which is herein incorporated by reference in its entirety.

BACKGROUND

Field of Invention

The present disclosure relates to a temperature control device and a temperature control method. More particularly, the present disclosure relates to a temperature control device and a temperature control method applied to an optical transceiver module.

Description of Related Art

Conventional optical transceiver module includes a temperature controller and an optical transceiver. Temperature controller is usually disposed on the same plane as the optical transceiver. In order to arrange two functional components on the same plane, temperature controller needs to be placed below the optical transceiver first, and then the optical transceiver is placed. Therefore, there are defects such as high complexity of manufacturing process and low manufacturing yield. Furthermore, a temperature controller is usually located next to a header of an optical transceiver, which results a temperature control area of a temperature controller being too small to effectively control a current temperature of the optical transceiver. As a result, temperature control efficiency is poor and an effect is not as good as expected.

For the foregoing reason, there is a need to provide a suitable temperature control device to solve the problems of the prior art.

SUMMARY

One aspect of the present disclosure provides an optical transceiver module temperature control device. The optical transceiver module temperature control device includes a processor, a printed circuit board assembly, an optical transceiver module and a temperature adjustment element. The processor is configured to measure an ambient temperature. The printed circuit board assembly includes a first side and a second side. The first side is opposite to the second side. The optical transceiver module is disposed on the first side of the printed circuit board assembly. The temperature adjustment element is coupled to the processor, and is disposed on the second side of the printed circuit board assembly. The processor is configured to generate a temperature adjustment signal according to the ambient temperature and an operating temperature range. The temperature adjustment element is configured to perform heat exchange with the printed circuit board assembly according to the temperature adjustment signal to adjust a temperature of the optical transceiver module into the operating temperature range.

Another aspect of the present disclosure provides an optical transceiver module temperature control method. The optical transceiver module temperature control method is adapted to an optical transceiver module temperature control device. The optical transceiver module temperature control device includes a processor, a first temperature sensor, a printed circuit board assembly, an optical transceiver module and a temperature adjustment element. The optical transceiver module temperature control method includes following steps: measuring an ambient temperature by the processor; measuring a temperature of the optical transceiver module by the first temperature sensor, which the optical transceiver module is disposed on a first side of the printed circuit board assembly; determining whether the ambient temperature or the temperature exceeds an operating temperature range to generate a temperature adjustment signal to the temperature adjustment element by the processor, which the temperature adjustment element is disposed on a second side of the printed circuit board assembly, and partially overlaps with respect to a position of the optical transceiver module, which the first side and the second side are located on different planes; and performing heat exchange with the printed circuit board assembly according to the temperature adjustment signal to adjust the temperature of the optical transceiver module into the operating temperature range by the temperature adjustment element.

In view of the aforementioned shortcomings and deficiencies of the prior art, the present disclosure provides an optical transceiver module temperature control device and an optical transceiver module temperature control method. Through a design of an optical transceiver module temperature control device, a temperature adjustment element can heat/cool an optical transceiver module through a printed circuit board assembly, so that the optical transceiver module operates in an appropriate operating temperature range.

BRIEF DESCRIPTION OF THE DRAWINGS

The present disclosure can be more fully understood by reading the following detailed description of the embodiment, with reference made to the accompanying drawings as follows:

FIG. 7 depicts a flow chart of an optical transceiver module temperature control method according to some embodiments of the present disclosure.

DETAILED DESCRIPTION

Figure 1:
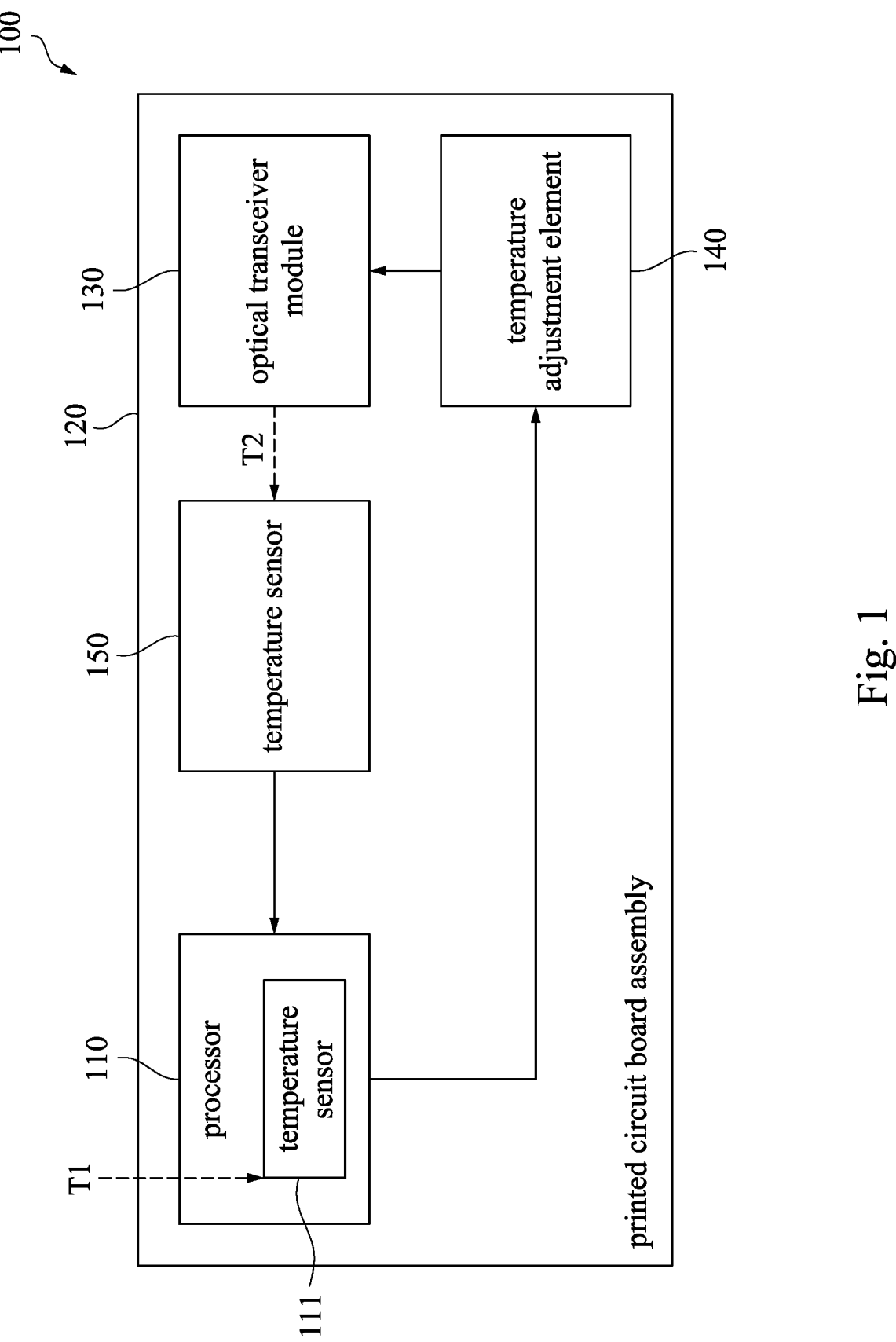
FIG. 1 depicts a schematic diagram of an optical transceiver module temperature control device according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 depicts a schematic diagram of an optical transceiver module temperature control device 100 according to some embodiments of the present disclosure. The optical transceiver module temperature control device 100 includes a processor 110, a printed circuit board assembly 120, an optical transceiver module 130, a temperature adjustment element 140 and a temperature sensor 150. The processor 110 is coupled to the temperature adjustment element 140 and the temperature sensor 150.

In some embodiments, the processor 110 is configured to measure an ambient temperature T1 and perform data processing. The processor 110 includes but not limited to a single processor and the integration of many micro-processors, for example, central processors (central processing unit, CPU) or graphic processors (graphic processing unit, GPU) and so on.

In some embodiments, the processor 110 includes a temperature sensor 111. The temperature sensor 111 includes thermocouple sensors, resistive temperature sensors, thermistors and fiber optic temperature sensors. The temperature sensor 111 is configured to measure the ambient temperature T1 outside the optical transceiver module temperature control device 100.

The processor 110, the optical transceiver module 130, the temperature adjustment element 140 and the temperature sensor 150 are all assembled on the printed circuit board assembly 120. Compared with a printed circuit board, a difference between the printed circuit board assembly 120 and the printed circuit board is whether electronic components are assembled on a circuit board.

In some embodiments, the optical transceiver module 130 is configured to convert between electrical signals and optical signals, and is connected to optical fibers (not shown in the figure) for optical signal transmission.

In some embodiments, the temperature adjustment element 140 is configured to adjust a temperature T2 of the optical transceiver module 130 through the printed circuit board assembly 120. The temperature adjustment element 140 includes a thermoelectric cooling chip. The thermoelectric cooling chip is made of thermoelectric materials. Heating or cooling is achieved by inputting electric current to thermoelectric materials. Thermoelectric cooling chips have a characteristic of changing a direction of heat conduction by changing an input direction of an electric current.

In some embodiments, the temperature sensor 150 is configured to sense the temperature T2 of the optical transceiver module 130. The temperature sensor 150 includes thermocouple sensors, resistive temperature sensors, thermistors and fiber optic temperature sensors.

Conventional optical transceiver module includes a temperature controller and an optical transceiver. The temperature controller is usually located next to a header of the optical transceiver. However, an area of the temperature controller is too small, and most of the heat generated by the temperature controller is dissipated through gas, so that the temperature controller cannot accurately control a current temperature of the optical transceiver. Overall, conventional temperature controller is not efficient at controlling the optical transceiver.

Figure 2:
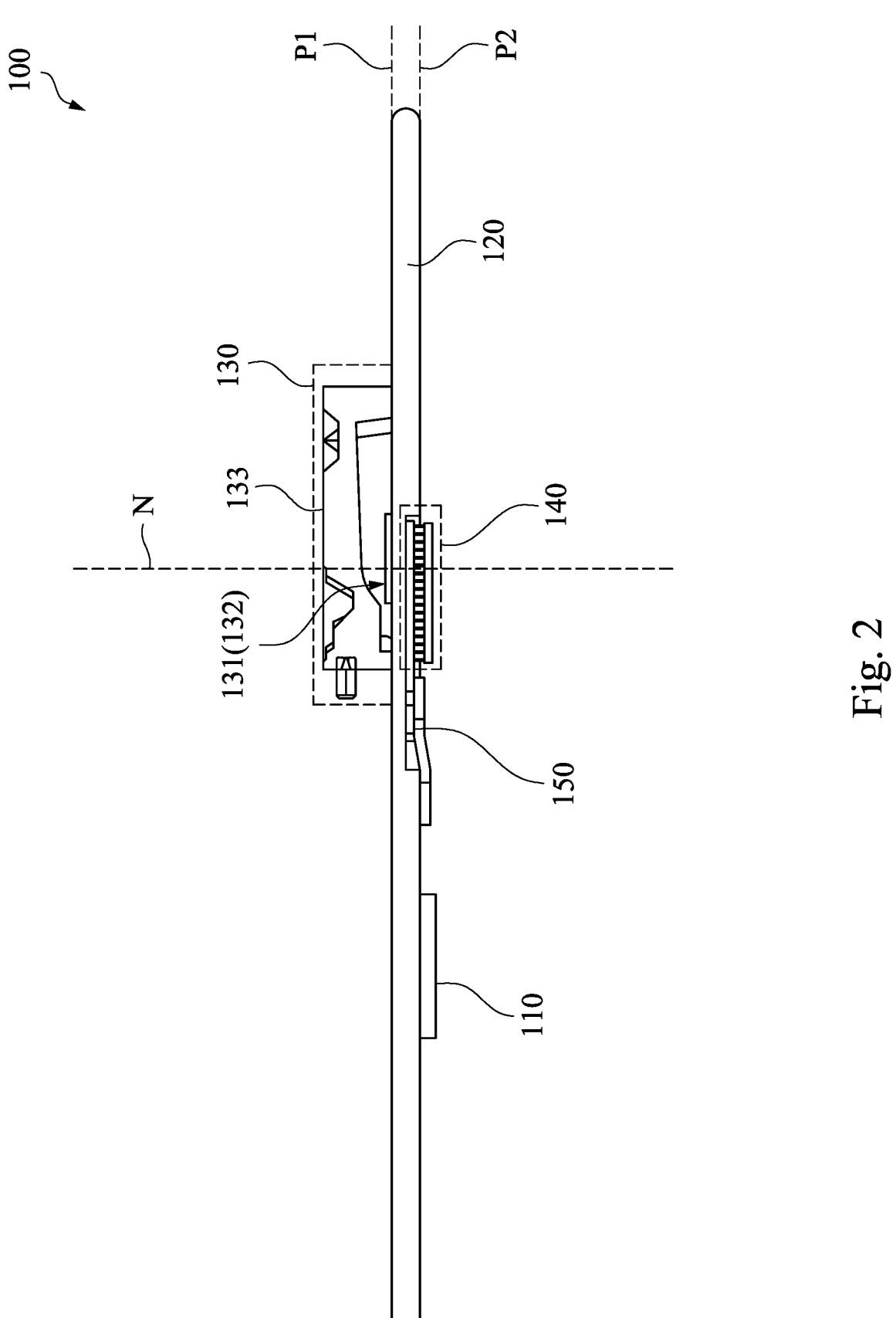
FIG. 2 depicts a schematic side view of an optical transceiver module temperature control device according to some embodiments of the present disclosure.

FIG. 2 depicts a schematic side view of the optical transceiver module temperature control device 100 according to some embodiments of the present disclosure. In some embodiments, please refer to FIG. 1 and FIG. 2, the processor 110 is configured to measure the ambient temperature T1 outside the optical transceiver module temperature control device 100. The printed circuit board assembly 120 includes a side P1 and a side P2. The side P1 is opposite to the side P2. The optical transceiver module 130 is disposed on the side P1 of the printed circuit board assembly. The temperature adjustment element 140 is coupled to the processor 110, and is disposed on the side P2 of the printed circuit board assembly 120. The processor 110 is configured to generate a temperature adjustment signal according to the ambient temperature T1 and an operating temperature range of the optical transceiver module 130. The temperature adjustment element 140 is configured to perform heat exchange with the printed circuit board assembly 120 according to the temperature adjustment signal, so as to adjust the temperature T2 of the optical transceiver module 130 into the operating temperature range through the printed circuit board assembly 120. In some embodiments, a temperature interval of the operating temperature range is between −20° C. to 85° C.

In some embodiments, the optical transceiver module 130 and the temperature adjustment element 140 overlap in a vertical direction N. The vertical direction N is perpendicular to the side P1 and the side P2 of the printed circuit board assembly 120. In some embodiments, the temperature adjustment element 140 partially overlaps with respect to a position of the transceiver module 130.

It should be noted that the temperature adjustment element 140 is configured to perform heat exchange (e.g.: releasing heat or absorbing heat) with the printed circuit board assembly 120 along the vertical direction N according to the temperature adjustment signal, and perform heat exchange (e.g.: releasing heat or absorbing heat) with the optical transceiver module 130 through the printed circuit board assembly 120, thereby improving heat transfer efficiency. Compared with the conventional temperature controller located next to the header of the optical transceiver, taking a structure in FIG. 2 as an example, conventional temperature controller is disposed on the side P1 and is located on a right side of the optical transceiver module 130. If conventional temperature controller is configured to heat the optical transceiver module 130, energy generated by the temperature controller will diffuse to a surrounding air medium, and only a few part of the energy (i.e.: heat conducted to the air on a left side) will reach the optical transceiver module 130.

The temperature adjustment element 140 of the optical transceiver module temperature control device 100 of the present disclosure is in contact with the printed circuit board assembly 120 so that the temperature adjustment element 140 can directionally transmit or absorb energy along the direction N to the printed circuit board assembly 120, thereby avoiding energy diffusion through an air medium as much as possible. In addition, the temperature adjustment element 140 is disposed on the side P2 of the printed circuit board assembly 120, which is opposite to the optical transceiver module 130. A temperature adjustment area of the temperature adjustment element 140 basically covers a contact area between the optical transceiver module 130 and the printed circuit board assembly 120. Therefore, compared with a thermal contact area of the conventional temperature controller, a thermal contact area of the temperature adjustment element 140 of the present disclosure is larger. The temperature adjustment element 140 of the present disclosure is more effective in controlling a temperature of a target element within a specific operating temperature range.

In some embodiments, the optical transceiver module 130 of the optical transceiver module temperature control device 100 is a mechanical optical transceiver module.

In some embodiments, please refer to FIG. 1 and FIG. 2, the processor 110 is disposed on one of the side P1 and the side P2 of the printed circuit board assembly 120. In some embodiments, the temperature sensor 111 of the processor 110 is configured to measure the ambient temperature T1 outside the optical transceiver module temperature control device 100.

In some embodiments, please refer to FIG. 2, the optical transceiver module 130 includes a laser chip 131, a photodetector 132 and an optical lens assembly 133. It should be noted that the optical transceiver is composed of the laser chip 131 and the photodetector 132.

In some embodiments, the laser chip 131 is configured to convert electrical signals into optical signals and send the optical signals out. The laser chip 131 includes one of a single mode laser chip and a multi-mode laser chip. It should be noted that laser emission wavelengths of a single mode laser chip and a multi-mode laser chip are different. In some embodiments, the laser chip 131 includes a light-emitting diode (LED) and a laser diode (LD). Since an operating temperature of each laser chip is different, a temperature interval of the operating temperature range of the optical transceiver module temperature control device 100 is adjusted and is set corresponding to operating temperatures of different laser chips.

In some embodiments, the photodetector 132 is configured to convert received optical signals into electrical signals. The photodetector 132 includes a PIN diode and an avalanche photodiodes (APD).

In some embodiments, the optical lens assembly 133 includes a combination of various optical passive components (e.g.: lens, prism, reflector, grating and so on).

In some embodiments, please refer to FIG. 1 and FIG. 2, the temperature sensor 150 is disposed on the side P2 of the printed circuit board assembly 120. The temperature sensor 150 is configured to measure the temperature T2 of the optical transceiver module 130. When the temperature T2 exceeds the operating temperature range, the processor 110 is configured to generate the temperature adjustment signal according to the temperature T2 of the optical transceiver module 130 and the operating temperature range of the optical transceiver module 130. The temperature adjustment element 140 is configured to perform heat exchange with the printed circuit board assembly 120 according to the temperature adjustment signal, thereby adjusting the temperature T2 of the optical transceiver module 130 into the operating temperature range through the printed circuit board assembly 120.

In some embodiments, the temperature adjustment signal can be generated when the ambient temperature T1 exceeds the operating temperature range or when the temperature T2 of the optical transceiver module 130 exceeds the operating temperature range. When the temperature adjustment element 140 is configured to receive the temperature adjustment signal, the temperature adjustment element 140 is configured to perform heat exchange with printed circuit board assembly 120 to adjust the temperature T2 of the optical transceiver module 130 into the operating temperature range through the printed circuit board assembly 120.

In some embodiments, the optical transceiver module 130 only includes the laser chip 131 and the photodetector 132.

In some embodiments, please refer to FIG. 2, the optical transceiver module temperature control device 100 includes a first side (e.g.: a right side of the figure) and a second side (e.g.: a left side of the figure). The second side is opposite to the first side. The processor 110 of the optical transceiver module temperature control device 100 is closest to the second side (e.g.: a left side of the figure). The optical transceiver module 130 and the temperature adjustment element 140 are closest to the first side (e.g.: a right side of the figure). The temperature sensor 150 is between the optical transceiver module 130 and the temperature adjustment element 140. The temperature sensor 150 is configured to measure the temperature of the optical transceiver module 130. The processor 110 is configured to measure the temperature outside the optical transceiver module temperature control device 100.

Figure 3B:
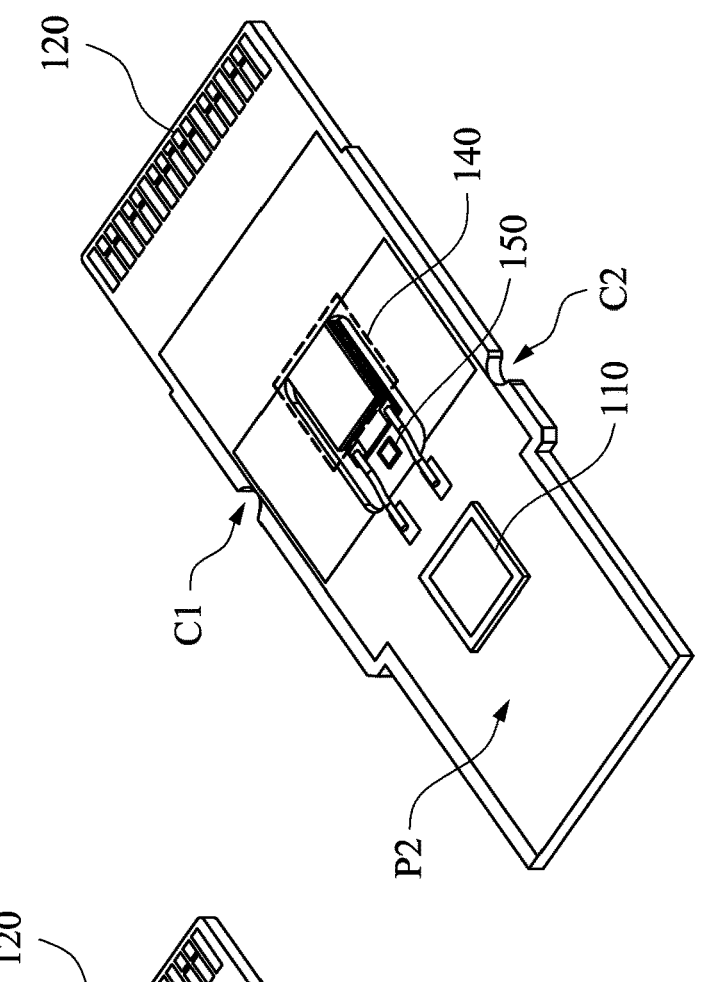
FIG. 3B depicts a schematic bottom view of an optical transceiver module temperature control device according to some embodiments of the present disclosure.
Figure 3A:
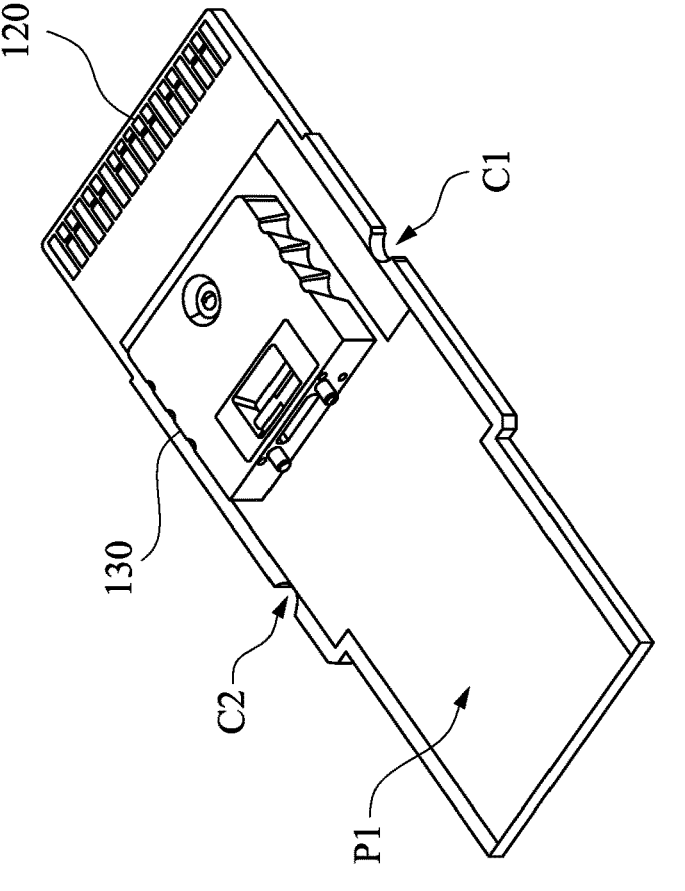
FIG. 3A depicts a schematic top view of an optical transceiver module temperature control device according to some embodiments of the present disclosure.

FIG. 3A depicts a schematic top view of the optical transceiver module temperature control device 100 in FIG. 2 according to some embodiments of the present disclosure. FIG. 3B depicts a schematic bottom view of the optical transceiver module temperature control device 100 in FIG. 2 according to some embodiments of the present disclosure. The embodiment of FIG. 3A and the embodiment of FIG. 3B respectively illustrate the front and back sides of the printed circuit board assembly 120. Taking the positions of the groove C1 and the groove C2 of the printed circuit board assembly 120 as a reference, a position of the optical transceiver module 130 substantially overlaps a position of the temperature adjustment element 140.

Figure 4:
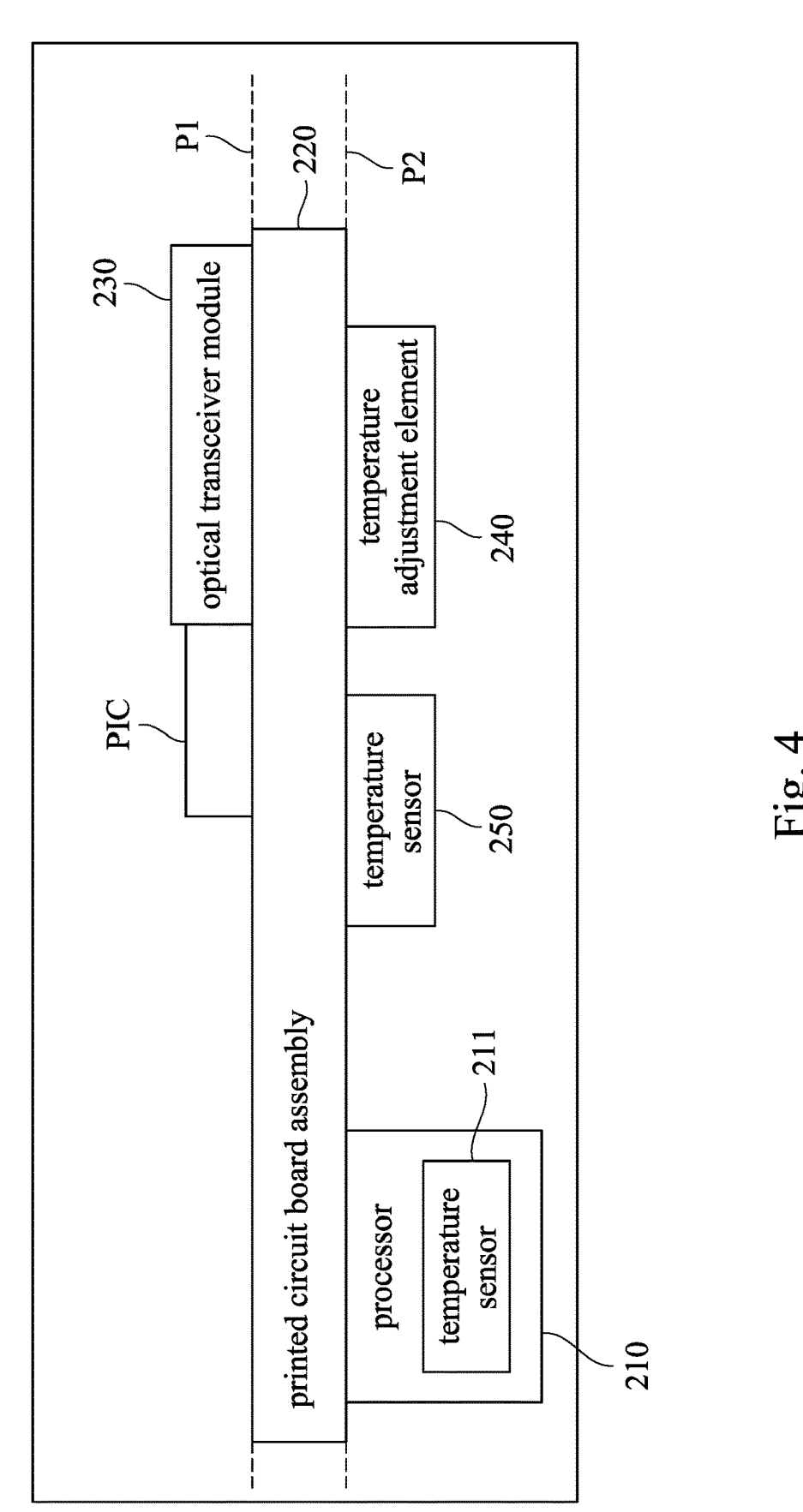
FIG. 4 depicts a schematic diagram of an optical transceiver module temperature control device according to some embodiments of the present disclosure.

FIG. 4 depicts a schematic diagram of an optical transceiver module temperature control device 200 according to some embodiments of the present disclosure. The optical transceiver module temperature control device 200 includes a processor 210, a printed circuit board assembly 220, an optical transceiver module 230, a temperature adjustment element 240, a temperature sensor 250 and a photonic integrated circuit PIC. The processor 210 is coupled to the temperature adjustment element 240 and the temperature sensor 250. The optical transceiver module 230 is disposed adjacent to the photonic integrated circuit PIC. In some embodiments, the optical transceiver module 230 of the optical transceiver module temperature control device 200 is a silicon photonics optical transceiver module. The processor 210 includes a temperature sensor 211.

The processor 210 is configured to measure an ambient temperature outside the optical transceiver module temperature control device 200. In some embodiments, the temperature sensor 211 of the processor 210 is configured to measure an ambient temperature outside the optical transceiver module temperature control device 200. The temperature sensor 250 is configured to measure the temperature of the optical transceiver module 230.

The printed circuit board assembly 220 includes a side P1 and a side P2. The side P1 is opposite to the side P2. The optical transceiver module 230 is disposed on the side P1 of the printed circuit board assembly 220. The temperature adjustment element 240 is coupled to the processor 210, and is disposed on the side P2 of the printed circuit board assembly 220. The processor 210 is configured to generate a temperature adjustment signal according the ambient temperature T1 and an operating temperature range of the optical transceiver module 230. In some embodiments, the processor 210 is configured to determine whether one of the ambient temperature T1 or the temperature T2 of the optical transceiver module 230 exceeds the operating temperature range of the optical transceiver module 230 to generate the temperature adjustment signal, and set judgment modes according to actual needs. The temperature adjustment element 240 is configured to perform heat exchange with the printed circuit board assembly 220 according to the temperature adjustment signal to adjust the temperature T2 of the optical transceiver module 230 into the operating temperature range through the printed circuit board assembly 220.

Figure 5:
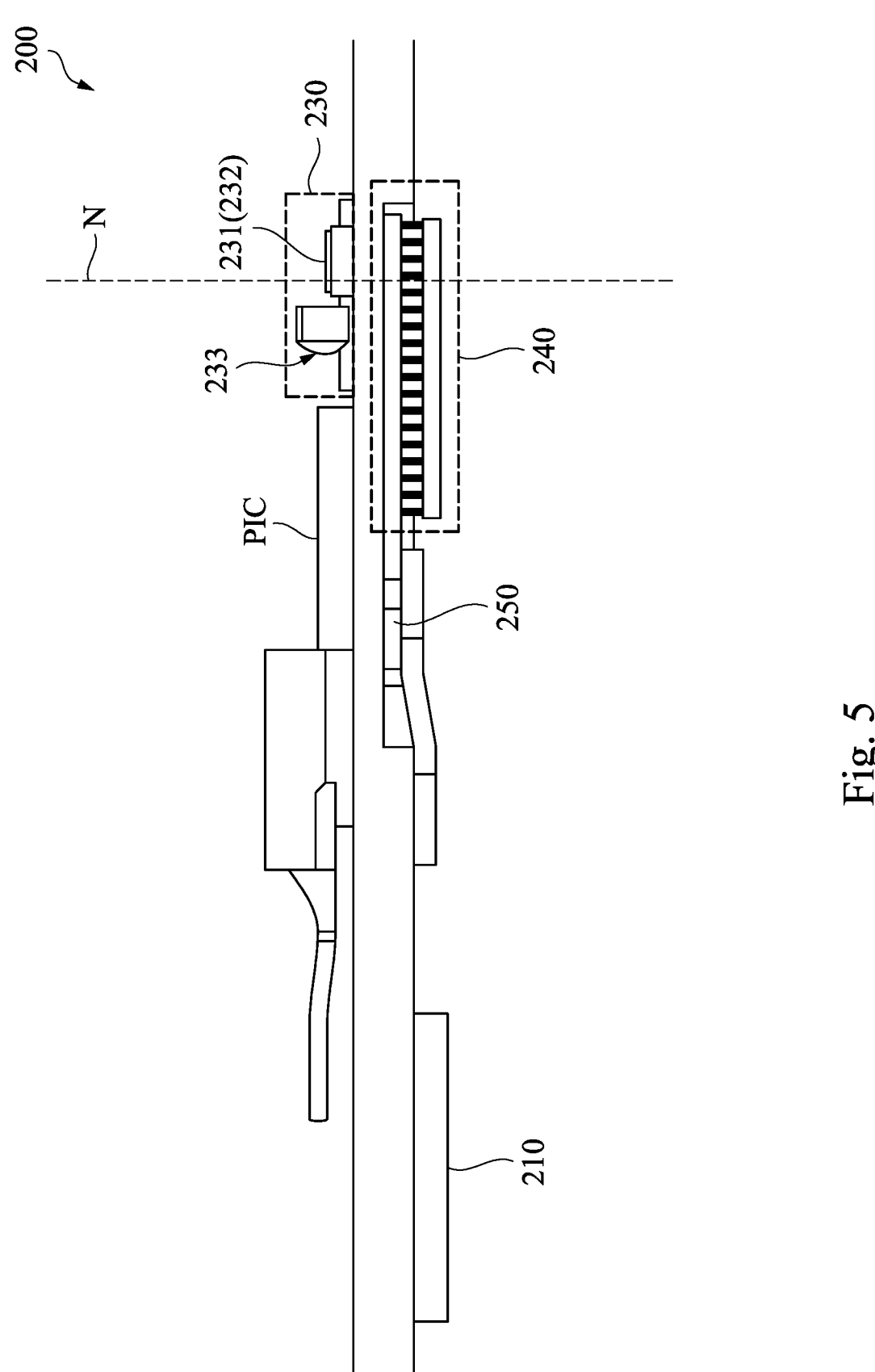
FIG. 5 depicts a schematic side view of an optical transceiver module temperature control device according to some embodiments of the present disclosure.

FIG. 5 depicts a schematic side view of the optical transceiver module temperature control device 200 in FIG. 4 according to some embodiments of the present disclosure. Connection methods and operations of the processor 210, the printed circuit board assembly 220, the optical transceiver module 230, the temperature adjustment element 240 and the temperature sensor 250 of the optical transceiver module temperature control device 200 are respectively similar to the processor 110, the printed circuit board assembly 120, the optical transceiver module 130, the temperature adjustment element 140 and the temperature sensor 150 of the optical transceiver module temperature control device 100 in FIG. 2. In addition, the optical transceiver module 230 includes a laser chip 231, a photodetector 232 and an optical lens assembly 233. Connection methods and operations of the laser chip 231, the photodetector 232 and the optical lens assembly 233 are respectively similar to the laser chip 131, the photodetector 132 and the optical lens assembly 133 in FIG. 2. For the sake of brevity, only differences are explained below.

Compared with the optical transceiver module temperature control device 100 in FIG. 2, the optical transceiver module temperature control device 200 in FIG. 4 includes a photonic integrated circuit PIC, and the optical lens assembly 233 is disposed between the photonic integrated circuit PIC and the optical transceiver (e.g.: the laser chip 231 and the photodetector 232). Components in a mechanical optical transceiver module are basically scattered on the printed circuit board, and some space needs to be designed to allow electrical signals to be transmitted along the wires. Compared with the mechanical optical transceiver module, a silicon photonic transceiver module basically integrates components on a small chip, and only optical fibers need to be designed to transmit optical signals, without a need to design wires for electrical signals. In addition, the optical lens assembly 133 of the optical transceiver module 130 in FIG. 2 covers the laser chip 131 and the photodetector 132.

Figures 6A, 6B:
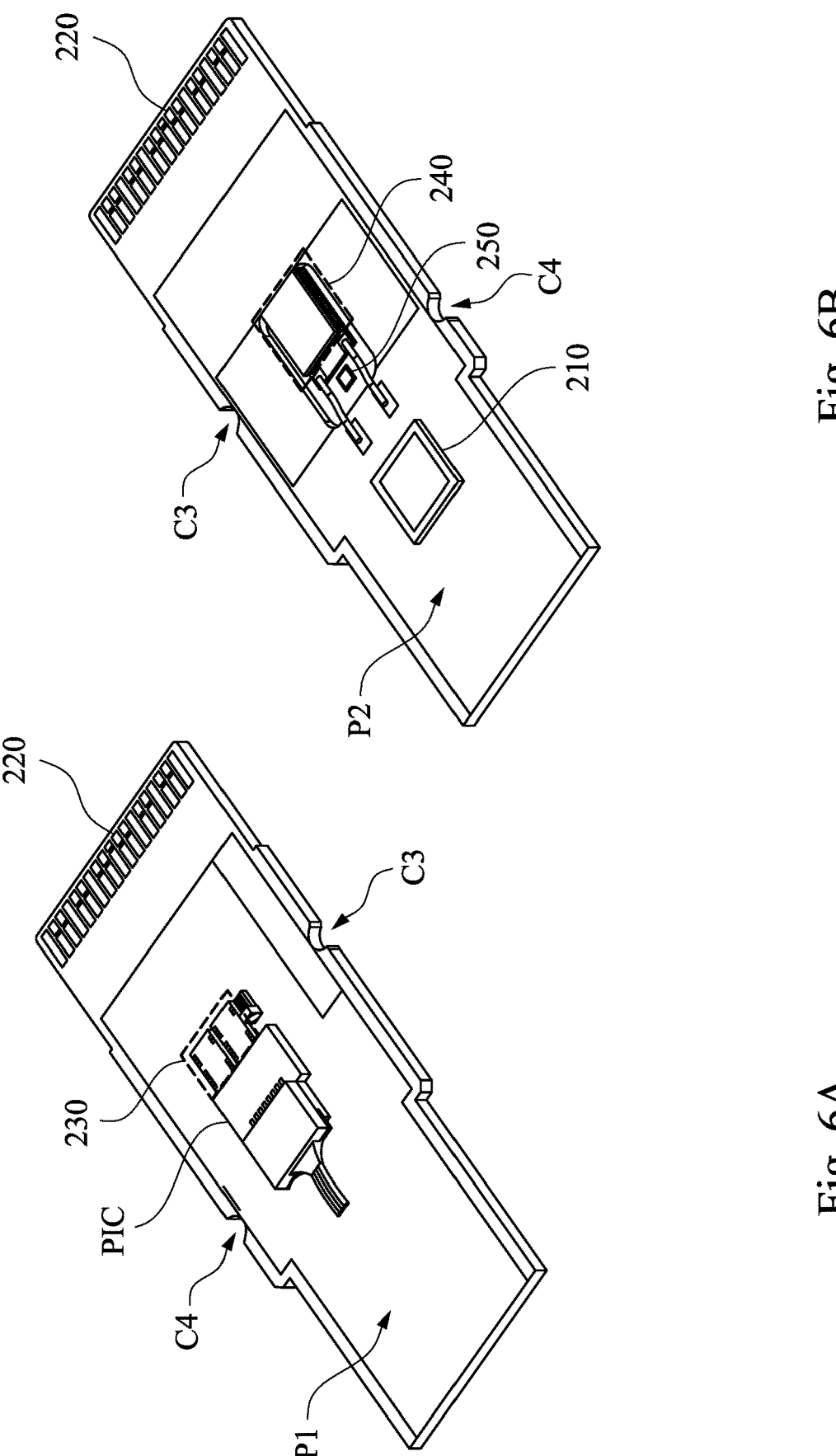
FIG. 6A depicts a schematic top view of an optical transceiver module temperature control device according to some embodiments of the present disclosure.
FIG. 6B depicts a schematic bottom view of an optical transceiver module temperature control device according to some embodiments of the present disclosure.

FIG. 6A depicts a schematic top view of the optical transceiver module temperature control device 200 in FIG. 5 according to some embodiments of the present disclosure. FIG. 6B depicts a schematic bottom view of the optical transceiver module temperature control device 200 in FIG. 5 according to some embodiments of the present disclosure. The embodiment of FIG. 6A and the embodiment of FIG. 6B respectively illustrate the front and back sides of the printed circuit board assembly 220. Taking the positions of the groove C3 and the groove C4 of the printed circuit board assembly 220 as a reference, a position of the optical transceiver module 230 substantially overlaps a position of the temperature adjustment element 240.

FIG. 7 depicts a flow chart of an optical transceiver module temperature control method 300 according to some embodiments of the present disclosure. In some embodiments, the optical transceiver module temperature control method 300 can be executed by the optical transceiver module temperature control device 100 in FIG. 2 or the optical transceiver module temperature control device 200 in FIG. 4. The optical transceiver module temperature control method 300 includes steps 310 to 340. Steps 310 to 340 will be described in following paragraphs. The following steps are described using the optical transceiver module temperature control device 100 as an example.

In step 310, please refer to FIG. 2 and FIG. 7, an ambient temperature T1 outside the optical transceiver module temperature control device 100 is measured by the processor 110 of the optical transceiver module temperature control device 100. In some embodiments, the ambient temperature T1 outside the optical transceiver module temperature control device 100 is measured by the temperature sensor 111 of the processor 110.

In step 320, please refer to FIG. 2 and FIG. 7, the temperature T2 of the optical transceiver module 130 is measured by the temperature sensor 150 of the optical transceiver module temperature control device 100.

In step 330, please refer to FIG. 2 and FIG. 7, the processor 110 of the optical transceiver module temperature control device 100 is configured to determine whether the ambient temperature T1 outside the optical transceiver module temperature control device 100 or the temperature T2 of the optical transceiver module 130 exceeds the operating temperature range of the optical transceiver module. When the ambient temperature T1 and the temperature T2 of the optical transceiver module 130 both exceed the operating temperature range of the optical transceiver module 130, the processor 110 is configured to calculate a first difference value according to the ambient temperature T1 and the operating temperature range, and is configured to calculate a second difference value according to the temperature T2 of the optical transceiver module 130 and the operating temperature range. The processor 110 is configured to obtain a larger difference value according to the first difference value and the second difference value, and generate the temperature adjustment signal according to the larger difference value to the temperature adjustment element 140. In addition, When one of the ambient temperature T1 and the temperature T2 of the optical transceiver module 130 exceeds the operating temperature range of the optical transceiver module 130, the processor 110 is configured to generate the temperature adjustment signal to the temperature adjustment element 140 according to an exceeded temperature difference corresponding to one of the ambient temperature T1 and the temperature T2.

In step 340, please refer to FIG. 2 and FIG. 7, the temperature adjustment element 140 is configured to perform heat exchange with the printed circuit board assembly 120 according to the temperature adjustment signal, thereby adjusting the temperature T2 of the optical transceiver module 130 to the operating temperature range.

For example, take a temperature interval of the operating temperature range of the optical transceiver module 130 to be set between −20° C. and 85° C. The ambient temperature T1 outside the optical transceiver module temperature control device 100 measured by the temperature sensor 111 of the processor 110 is −40° C., and the temperature T2 of the optical transceiver module 130 measured by the temperature sensor 150 is −30° C. The processor 110 is configured to generate the temperature adjustment signal to the temperature adjustment element 140 according to a lager temperature difference value (i.e.: a temperature difference value between the operating temperature range of −20° C. and the ambient temperature T1 of −40° C.).

For example, take a temperature interval of the operating temperature range of the optical transceiver module 130 to be set between −20° C. and 85° C. The ambient temperature T1 outside the optical transceiver module temperature control device 100 measured by the temperature sensor 111 of the processor 110 is −25° C., and the temperature T2 of the optical transceiver module 130 measured by the temperature sensor 150 is −15° C. The processor 110 is configured to determine that the ambient temperature T1 exceeds the operating temperature range, that is, calculates a temperature difference value according to the temperature interval between the ambient temperature T1 and the operating temperature range, thereby generating a temperature adjustment signal to the temperature adjustment element 140 according to the temperature difference value. The temperature adjustment element 140 is configured to perform heat exchange with the printed circuit board assembly 120 according to the temperature adjustment signal to adjust the temperature T2 of the optical transceiver module 130 to maintain the optical transceiver module 130 within the temperature interval of the operating temperature range.

For example, when the temperature sensor 150 is configured to sense that the temperature T2 of the optical transceiver module 130 is 95° C. and the optical transceiver module 130 is in an overheating state, even if the ambient temperature T1 does not exceed the operating temperature range of the optical transceiver module 130, the processor 110 is configured to calculate a temperature difference value according to the ambient temperature T2 and the temperature interval of the aforementioned operating temperature range so as to generate the temperature adjustment signal to the temperature adjustment element 140. The processor 110 is configured to maintain the optical transceiver module 130 within the temperature interval of the operating temperature range according to the temperature interval of the operating temperature range.

Following the example of low temperature in the aforementioned step, the temperature adjustment element 140 is configured to generate a temperature difference between its two ends in a specific direction according to the temperature adjustment signal of the processor 110, thereby heating the printed circuit board assembly 120, so that the temperature T2 of the operating optical transceiver module 130 increases from −30° C. to above −20° C., which is the lowest temperature of the operating temperature range.

Following the example of high temperature in the aforementioned step, the temperature adjustment element 140 is configured to generate a temperature difference between its two ends in a specific direction according to the temperature adjustment signal of the processor 110, thereby cooling printed circuit board assembly 120, so that the temperature T2 of the operating optical transceiver module 130 decreases from 95° C. to below 85° C., which is the highest temperature of the operating temperature range.

It should be noted that the operation mode of the optical transceiver module temperature control device 200 is similar to the operation mode of the optical transceiver module temperature control device 100. To keep the description concise, repetitious details are omitted herein.

Based on the aforementioned embodiments, the present disclosure provides an optical transceiver module temperature control device and an optical transceiver module temperature control method. Through a design of an optical transceiver module temperature control device, a temperature adjustment element and an optical transceiver module are respectively arranged on both sides of a printed circuit board assembly, to allow a temperature adjustment element to heat/cool an optical transceiver module through a printed circuit board assembly so that the optical transceiver module operates within an appropriate operating temperature range.

Certain terms are used in the specification and the claims to refer to specific components. However, those of ordinary skill in the art would understand that the same components may be referred to by different terms. The specification and claims do not use the differences in terms as a way to distinguish components, but the differences in functions of the components are used as a basis for distinguishing. Furthermore, it should be understood that the term "comprising" used in the specification and claims is open-ended, that is, including but not limited to. In addition, "coupling" herein includes any direct and indirect connection means. Therefore, if it is described that the first component is coupled to the second component, it means that the first component can be directly connected to the second component through electrical connection or signal connections including wireless transmission, optical transmission, and the like, or the first component is indirectly electrically or signally connected to the second component through other component(s) or connection means.

It will be understood that, in the description herein and throughout the claims that follow, the phrase "and/or" includes any and all combinations of one or more of the associated listed items. Unless the context clearly dictates otherwise, the singular terms used herein include plural referents.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. An optical transceiver module temperature control device, comprising:

a processor, configured to measure an ambient temperature;

a printed circuit board assembly, comprising a first side and a second side, wherein the first side is opposite to the second side;

an optical transceiver module, disposed on the first side of the printed circuit board assembly;

a temperature adjustment element, coupled to the processor, and disposed on the second side of the printed circuit board assembly, wherein the processor is configured to generate a temperature adjustment signal according to the ambient temperature and an operating temperature range, wherein the temperature adjustment element is configured to perform heat exchange with the printed circuit board assembly according to the temperature adjustment signal to adjust a temperature of the optical transceiver module into the operating temperature range; and a first temperature sensor, coupled to the processor, and disposed on the second side of the printed circuit board assembly, wherein the first temperature sensor is configured to measure the temperature of the optical transceiver module.

2. The optical transceiver module temperature control device of claim 1, wherein when the temperature exceeds the operating temperature range, the processor is configured to generate the temperature adjustment signal according to the temperature and the operating temperature range.

3. The optical transceiver module temperature control device of claim 1, wherein the optical transceiver module and the temperature adjustment element overlap in a vertical direction, wherein the vertical direction is perpendicular to the first side and the second side of the printed circuit board assembly.

4. The optical transceiver module temperature control device of claim 3, wherein the processor is disposed on one of the first side and the second side of the printed circuit board assembly.

5. The optical transceiver module temperature control device of claim 1, wherein the processor comprises:

a second temperature sensor, configured to measure the ambient temperature outside the optical transceiver module temperature control device.

6. The optical transceiver module temperature control device of claim 1, further comprising:

a photonic integrated circuit, disposed on the first side of the printed circuit board assembly, wherein the optical transceiver module is disposed adjacent to the photonic integrated circuit.

7. The optical transceiver module temperature control device of claim 1, wherein the optical transceiver module comprises one of a laser chip and a photodetector.

8. The optical transceiver module temperature control device of claim 7, wherein the laser chip comprises one of a single mode laser chip and a multi-mode laser chip.

9. The optical transceiver module temperature control device of claim 7, wherein the operating temperature range is adjusted corresponding to an operating temperature of the laser chip.

10. The optical transceiver module temperature control device of claim 1, wherein a temperature interval of the operating temperature range is between −20° C. to 85° C.

11. The optical transceiver module temperature control device of claim 1, wherein the temperature adjustment element comprises a thermoelectric cooling chip.

12. An optical transceiver module temperature control method, adapted to an optical transceiver module temperature control device, wherein the optical transceiver module temperature control device comprises a processor, a first temperature sensor, a printed circuit board assembly, an optical transceiver module and a temperature adjustment element, wherein the optical transceiver module temperature control method comprises:

measuring an ambient temperature by the processor;

measuring a temperature of the optical transceiver module by the first temperature sensor, wherein the optical transceiver module is disposed on a first side of the printed circuit board assembly, wherein the first temperature sensor is coupled to the processor and is disposed on a second side of the printed circuit board assembly;

determining whether the ambient temperature or the temperature exceeds an operating temperature range to generate a temperature adjustment signal to the temperature adjustment element by the processor, wherein the temperature adjustment element is disposed on the second side of the printed circuit board assembly, and partially overlaps with respect to a position of the optical transceiver module, wherein the first side and the second side are located on different planes; and performing heat exchange with the printed circuit board assembly according to the temperature adjustment signal to adjust the temperature of the optical transceiver module into the operating temperature range by the temperature adjustment element.

13. The optical transceiver module temperature control method of claim 12, wherein the processor comprises a second temperature sensor, further comprising:

measuring the ambient temperature of one of the first side and the second side of the printed circuit board assembly by the second temperature sensor.

14. The optical transceiver module temperature control method of claim 13, wherein the temperature adjustment signal is generated by the following operations:

calculating a first difference value according to the ambient temperature and the operating temperature range by the processor;

calculating a second difference value according to the temperature and the operating temperature range of the optical transceiver module by the processor;

obtaining a larger difference value according to the first difference value and the second difference value by the processor; and generating the temperature adjustment signal according to the larger difference value to control the temperature adjustment element by the processor.

15. The optical transceiver module temperature control method of claim 12, wherein the processor is disposed on one of the first side and the second side of the printed circuit board assembly.

16. The optical transceiver module temperature control method of claim 12, wherein the optical transceiver module is disposed adjacent to a photonic integrated circuit, wherein the photonic integrated circuit is disposed on the first side of the printed circuit board assembly.

17. The optical transceiver module temperature control method of claim 12, wherein the optical transceiver module comprises one of a laser chip and a photodetector.

18. The optical transceiver module temperature control method of claim 17, wherein the laser chip comprises one of a single mode laser chip and a multi-mode laser chip.

19. The optical transceiver module temperature control method of claim 17, wherein the operating temperature range is adjusted corresponding to an operating temperature of the laser chip.

20. The optical transceiver module temperature control method of claim 12, wherein the temperature adjustment element comprises a thermoelectric cooling chip.

* * * * *